US008340949B2

(12) United States Patent
Kasimsetty et al.

(10) Patent No.: US 8,340,949 B2
(45) Date of Patent: Dec. 25, 2012

(54) OCCUPANT POSITIONING MODULE

(75) Inventors: Vinayakumar Kasimsetty, Troy, MI (US); Gunasekar Tj, Canton, MI (US); Yun Lu, Troy, MI (US)

(73) Assignee: Chrysler Group LLC, Auburn Hills, MI (US)

( * ) Notice: Subject to any disclaimer, the term of this patent is extended or adjusted under 35 U.S.C. 154(b) by 571 days.

(21) Appl. No.: 11/862,269

(22) Filed: Sep. 27, 2007

(65) Prior Publication Data

US 2009/0089016 A1  Apr. 2, 2009

(51) Int. Cl.
*G06G 7/48* (2006.01)

(52) U.S. Cl. .............................................. 703/8; 703/1

(58) Field of Classification Search ........................ 703/8
See application file for complete search history.

(56) References Cited

OTHER PUBLICATIONS

Bosch et al. Development and Evaluation of Smart Restraints: EC PRISM, 5th European MADYMO User Conference Cambridge Sep. 26-27, 2005.*
Neale et al. "A Numerical Investigation into the Effectiveness of "Smart" Restraint Systems in Mitigating Injury Risk Under Real World Accident Conditions", Proceedings of the 19th International Technical Conference on the Enhanced Safety of Vehicles ESV (2005).*
Bosch et al. Development and Evaluation of Smart Restraints: EC PRISM, 5th European MADYMO User Conference Cambridge Sep. 26-27, 2005.*
Chen et al. "An Adaptable Model for Distributed Collaborative Desgn", Computer Aided Design and Applications vol. 2, No. 1-4, 2005.*
Steffan et al. "A New Approach to Occupant Simulation Through Couplding of PC-Crash and MADYMO" Mar. 1999.*
Marzoughi et al. "Development and Validation of an NCAP Simulation Using LS-DYNA3D", FHWA/NHTSA 1996.*
Narayanasamy, et al., "An Integrated Testing and CAE Application Methodology for Curtain Airbad Development", SAE 2005-01-0289, Apr. 11-14, 2005, 10 pages.
Scholpp, et al., "CAE Application for the Layout of an Occupant Classification Sensor Mat", SAE 2005-01-0461, Apr. 11-14, 2005, pp. 1-10.
Intel Corporation, "Solution Blueprint: Crash Test Simulation and Analysiss Solution", 2002, pp. 3-14.
MSC.Software Corporation, "MSC.Software Increases Crash and Occupant Safety Simulation Capabilities with MSC.Dytran 2004", Feb. 12, 2004, http://news.thomasnet.com/fullstory/30646/2585, 5 pages.
StereoGraphics Corporation, "Ford Motor Company Drives its Design with CrystalEyes From StereoGraphics", 1997-2005, http://www.stereographics.com/news_about_us/success_stories/body_ford_motor_co..html 4 pages.

* cited by examiner

*Primary Examiner* — Saif Alhija
(74) *Attorney, Agent, or Firm* — Ralph E. Smith

(57) ABSTRACT

A vehicle test system includes an occupant positioning module that receives a virtual vehicle and a virtual dummy. The occupant positioning module generates a first set of parameters based on the virtual vehicle, the virtual dummy and a first adapted vehicle standard. N groups receive the first set of parameters. N is an integer greater than 1.

20 Claims, 4 Drawing Sheets

OCCUPANT POSITIONING MODULE

FIELD

The present disclosure relates to virtual systems and more particularly to positioning of a virtual dummy within a virtual vehicle.

BACKGROUND

The statements in this section merely provide background information related to the present disclosure and may not constitute prior art.

Federal Motor Vehicle Safety Standards (FMVSS), which are incorporated by reference herein in their entirety, are administered by the United States Department of Transportation's National Highway Traffic Safety Administration. Manufacturers of motor vehicles must conform and certify compliance to the FMVSS. The FMVSS are regulations that include minimum safety performance requirements for motor vehicles.

The FMVSS dictate parameters for various crash and impact tests. Anthropomorphic test dummies (ATDs) are often used in such tests. Virtual models of vehicles and ATDs may be constructed and analyzed prior to physical tests.

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

SUMMARY

A vehicle test system includes an occupant positioning module that receives a virtual vehicle and a virtual dummy. The occupant positioning module generates a first set of parameters based on the virtual vehicle, the virtual dummy and a first adapted vehicle standard. N groups receive the first set of parameters. N is an integer greater than 1.

In other features, the system includes a computer aided design (CAD) module that generates the virtual vehicle. The system includes a virtual dummy database that includes at least one of virtual $95^{th}$ percentile, $50^{th}$ percentile, $5^{th}$ percentile, and child dummies. A test module generates the first adapted vehicle standard based on a first vehicle standard. The first adapted vehicle standard includes associations between components of a second virtual vehicle (that has at least similar components as the first virtual vehicle) and portions of the virtual dummy. The first virtual vehicle and second virtual vehicle may have the same make and model or different makes and models. Further, the second virtual vehicle may include the same make and model as the first virtual vehicle but may also include subsequent development on that make and model.

In other features, the occupant positioning module generates the first set of parameters by applying the associations to the components of the first virtual vehicle. The vehicle test system includes a positioning code module that converts the first set of parameters into a code. The N groups receive the first set of parameters via the code.

In other features, the code includes Extensible Markup Language (XML). The first virtual vehicle include a first set of points in an X,Y,Z coordinate system that correspond to components; and the virtual dummy includes a second set of points in the X,Y,Z coordinate system that correspond to body parts. The occupant positioning module generates the first set of parameters by linking at least a number of the first set of points with at least a number of the second set of points. The linked first and second sets of points remain at least one of predetermined distances apart and at predetermined angles relative to one another.

In other features, the predetermined distances and the predetermined angles are based on the first adapted vehicle standard. The first adapted vehicle standard corresponds to Federal Motor Vehicle Safety Standards (FMVSS). A first one of the N groups comprises a group that performs impact tests. A second one of the N groups designs and develops vehicles. The first one of the N groups receives the first set of parameters and relates the virtual vehicle and the dummy according to the first set of parameters.

Further areas of applicability will become apparent from the description provided herein. It should be understood that the description and specific examples are intended for purposes of illustration only and are not intended to limit the scope of the present disclosure.

DRAWINGS

The drawings described herein are for illustration purposes only and are not intended to limit the scope of the present disclosure in any way.

DETAILED DESCRIPTION

Figure 1:
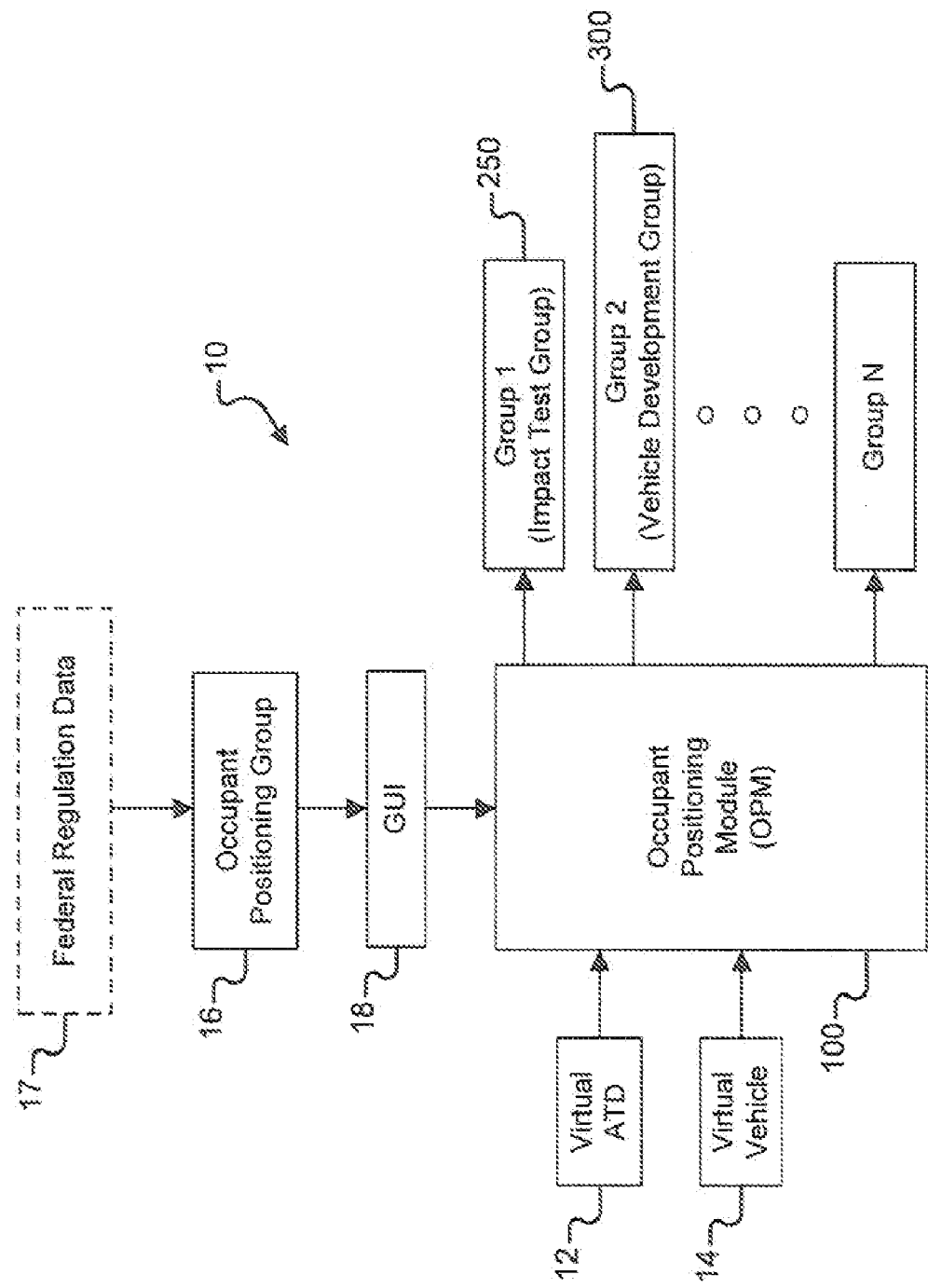
FIG. 1 is a functional block diagram of a vehicle test system according to the present disclosure.

The following description is merely exemplary in nature and is in no way intended to limit the disclosure, its application, or uses. For purposes of clarity, the same reference numbers will be used in the drawings to identify similar elements. As used herein, the phrase at least one of A, B, and C should be construed to mean a logical (A or B or C), using a non-exclusive logical or. It should be understood that steps within a method may be executed in different order without altering the principles of the present disclosure.

As used herein, the term module refers to an Application Specific Integrated Circuit (ASIC), an electronic circuit, a processor (shared, dedicated, or group) and memory that execute one or more software or firmware programs, and/or a combinational logic circuit.

Anthropomorphic test dummies (ATDs) are used to test Federal Motor Vehicle Safety Standards (FMVSS), New Car Assessment Program (NCAP) standards, Insurance Institute for Highway Safety (IIHS) standards, Economic Commission for Europe (ECE) standards, European New Car Assessment Program (EuroNCAP) standards, and Side Impact New Car Assessment Program (SINCAP) standards, among others.

Generally, a vehicle manufacturer determines specific parameters for placement of the ATDs so that standards, such as FMVSS, may be met. Vehicle manufacturers often generate virtual vehicles and virtual ATDs on which virtual impact tests are performed. The ATDs are placed according to the parameters. Different groups within the vehicle manufacturer may interpret the parameters differently, thus resulting in variations in crash test results.

Referring now to FIG. 1, the present disclosure provides a system 10 and method for standardizing positioning of a virtual ATD 12 within a virtual vehicle 14. An occupant positioning group 16 receives federal regulation data 17, such as FMVSS. The occupant positioning group 16 may input the data via a graphical user interface (GUI) 18 into an occupant positioning module (OPM) 100. The OPM 100 generates a positioning configuration for the virtual vehicle 14 and the virtual ATD 12 based on the FMVSS. The OPM 100 may generate a code that automatically links a virtual ATD and a virtual vehicle based on the positioning configuration.

The OPM 100 transmits the positioning configuration and or the code to groups 1, 2, ..., and N that use the configuration to run tests on the virtual vehicle (impact test group 250), modify the design of the virtual vehicle (vehicle development group 300), etc. In this manner, FMVSS are implemented consistently throughout the groups because each group does not have to separately interpret the FMVSS. When the FMVSS changes, the occupant positioning group 16 enters the changes. The OPM 100 responds to the changes and generates another positioning configuration. Each of the groups may include one or more individuals.

Figure 2:
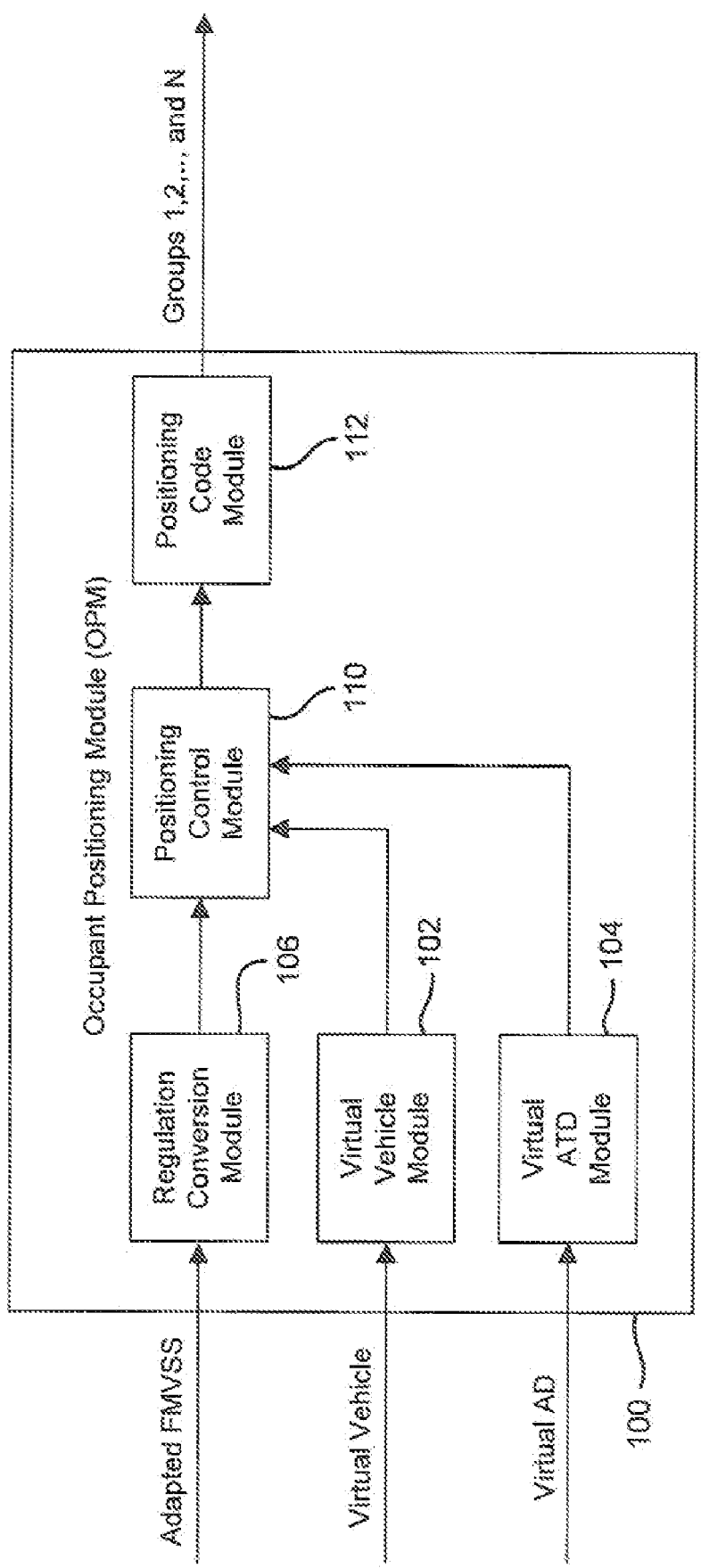
FIG. 2 is a is a functional block diagram of an occupant positioning module according to the present disclosure.

Referring now to FIG. 2, the OPM 100 is further illustrated. The OPM 100 may include a virtual vehicle module 102 that receives the virtual vehicle. A virtual ATD module 104 receives the virtual ATD. A regulation conversion module 106 receives the FMVSS, which may be previously adapted for use by the OPM 100 (e.g. in computer readable code that links virtual vehicle to ATDs in predetermined ways). If the FMVSS has not already been adapted, the regulation conversion module 106 adapts the FMVSS into a set of predetermined relationships between an ATD and a virtual vehicle.

The relationships may include a set of graphical points on representations of components of a virtual vehicle that are linked to a set of points of portions of the ATD. The set of points of portions of the ATD may correspond to points associated with graphical representations of ATD body parts. When the ATD and virtual vehicle points are linked, the respective vehicle components and body parts may automatically assume predetermined positions when the relationships are used.

A positioning control module 110 generates a position configuration that relates the virtual vehicle to the ATD based on the adapted FMVSS. Generally, the positioning control module 110 links components of the virtual vehicle to portions of the ATD according to the linked sets of points based on the adapted FMVSS. The virtual vehicle of the linked set of points may be a generic virtual vehicle that may differ from the virtual vehicle received in the virtual vehicle module 102.

The virtual vehicle received in the virtual vehicle module 102 may be a representation of a vehicle under design. Therefore, the positioning control module 110 may determine sets of points of components of the design virtual vehicle that correspond to the aforementioned sets of points of the generic virtual vehicle. For example, points associated with a steering wheel of the generic virtual vehicle may now be used on association with the design virtual vehicle. The positioning control module 110 may link the ATD to the design virtual vehicle according to this determination.

A positioning code module 112 generates a code based signals from the positioning control module 110. The code may be used by any of a number of groups (e.g. engineering groups of a vehicle manufacturer) to set up a virtual vehicle and ATD according to the code. The positioning code module 112 may transfer data (e.g. the code based on the position configuration) via Extensible Markup Language (XML), which is a general-purpose markup language. XML may facilitate the sharing of structured data across different information systems, particularly the Internet.

One of the groups may receive an ATD from an ATD database and a virtual representation of a vehicle under test. The group may automatically link the ATD to the virtual vehicle according to the code.

Figure 3:
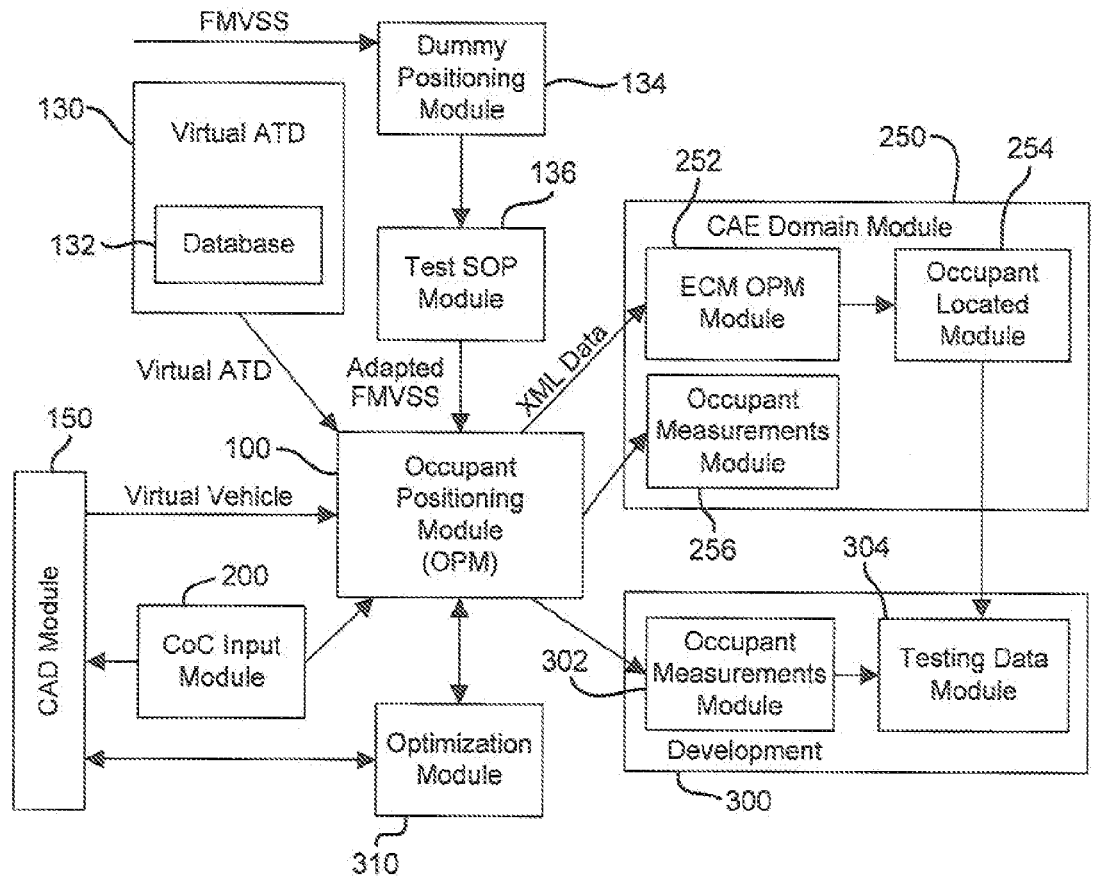
FIG. 3 is a functional block diagram of another vehicle test system according to the present disclosure.

The OPM 100 may interact with a plurality of modules as illustrated in FIG. 3. Important to note is that the modules may represent groups, as discussed with regard to FIG. 1. Alternatively, respective groups may use the modules to coordinate the described functionality of the modules.

Referring now to FIG. 3, an ATD module 130 provides a virtual representation of an ATD. The ATD may be based on average dimensions of a male or female. The ATD may be selected from a group of standard dummy models stored in a database 132 of the ATD module 130. The group of standard dummy models may include male or female $95^{th}$ percentile, $50^{th}$ percentile, $5^{th}$ percentile, and/or child dummies, which may also be used.

A dummy positioning module 134 may determine parameters of an ATD that are to be set based on the FMVSS. The parameters may correspond to predetermined points on body parts of the ATD. A test module 136 may receive the parameters and may adapt the FMVSS to correspond to positions for a dummy relative to portions of the vehicle according to standard operating procedures (SOP). The SOP may include predetermined guidelines. This adapted FMVSS may be referred to as an interpreted FMVSS.

Figure 3A:
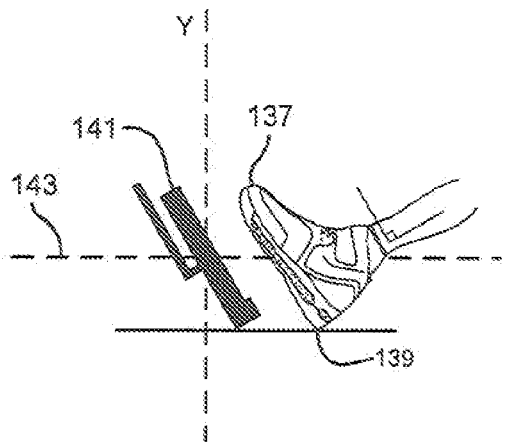
FIG. 3A is a side view of a foot of a virtual dummy according to the present disclosure.
Figure 3B:
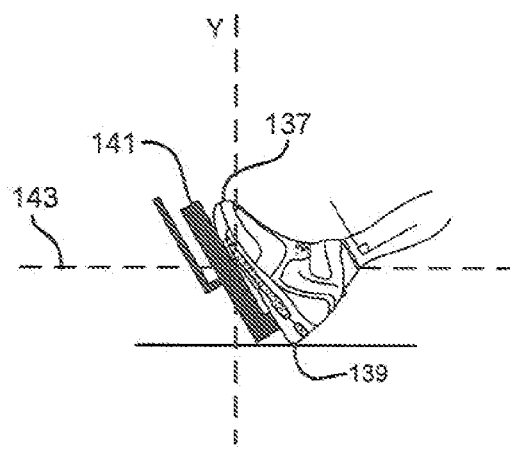
FIG. 3B is a side view of a foot of a virtual dummy according to the present disclosure.

Referring now to FIGS. 3A and 3B, the test module 136 may adapt and/or include a predetermined adaptation of the FMVSS. For example, the FMVSS may include the phrase "as practicable, the driver's leg should be straight along the vertical plane." In response to this requirement, the test module 136 may place a right foot 137 of the ATD on the accelerator pedal. This may be accomplished by first locating a Y-plane (that fills the FMVSS requirement) that intersects the three-dimensional (3-D) center of the accelerator pedal 141. The test module 136 may determine a distance from a heel 139 of the foot 137 to the Y-plane. A first command may move the foot 137 based on the distance so that the foot 137 intersects the Y-plane and contacts the accelerator pedal 141. The first command may be referred to as a kinematics command.

The test module 136 may then provide a line 143 parallel to the carpet line at the center of the pedal 141 and intersect this line 143 with the pedal 141 and the bottom of the foot 137. The distance (based on the FMVSS) between the pedal 141 and bottom of the foot 137 may be set according to a second command. The test module 136 may use a third command to adjust the relationship of foot 137 to pedal 141 so that the foot 137 is close to tangential to the pedal 141. The test module 136 may use fourth and fifth commands to adjust the angle of the foot 137 relative to the pedal 141 so that the interpretation of the FMVSS may be realized.

The FMVSS may include the phrase "as practicable, the driver's left leg should be parallel to the vertical centerline of the vehicle." The test module 136 may respond by setting the heel of the left foot on the carpet line and as close to the toepan as possible. The test module 136 may accomplish the aforementioned by generating a point relative to a point on a brake pedal. The width of the shoe may be set at 59 mm and the desired clearance of 10 mm from shoe to pedal may be set. The test module 136 may place another Y-axis at the point through the toepan/clearance for the left foot. The test module 136 may generate a sixth command that may instruct set-up of the left foot according to the FMVSS.

The test module 136 may set up the hand positions on the steering wheel by setting X,Y,Z coordinates between the palms of the hands and by setting points on the steering wheel by, for example, bisecting the steering wheel with a Z-plane. The test module 136 may associate the palm coordinates with points on the Z-plane via a seventh command. Numerous other commands may be used to link a portion of an ATD to a virtual vehicle based on the FMVSS. The combinations of commands may collectively be used by the OPM 100 as an adapted FMVSS.

Figure 4:
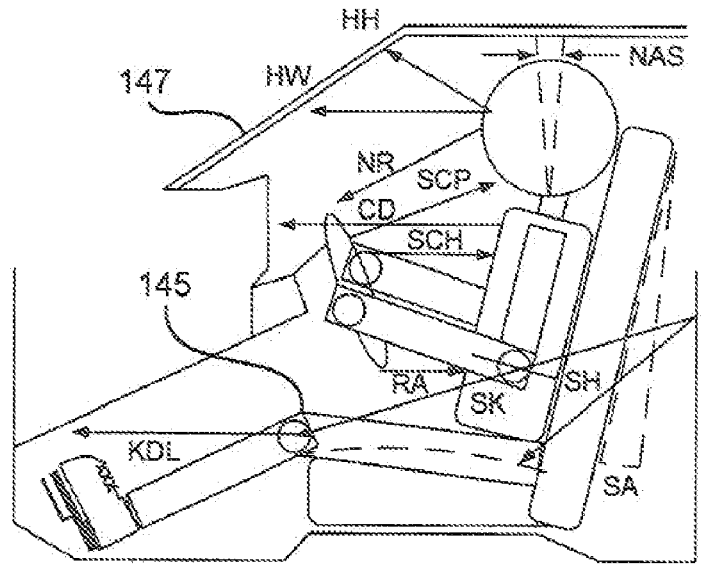
FIG. 4 is a perspective diagram of a virtual dummy in a generic virtual vehicle according to the present disclosure.

Referring now to FIG. 4, the test module 136 may link portions of an ATD 145 to components of a generic virtual vehicle 147. The test module may link portions that are common to all vehicles, for example, roof, steering wheel, floor, etc. The OPM 100 may link the ATD 145 to the virtual vehicle 147 (that will be under test) according to the links and/or commands generated by the test module 136. The links and commands generated form the test module 136 may represent a version of the FMVSS that has been adapted for use by the OPM 100. The links/commands may include predetermined distances between the ATD 145 and the virtual vehicle 147.

For example, the test module 136 may link head to header (HH) taken from a center point between eyes (not shown) of the ATD 145 to a vehicle header directly in front of the ATD 145. The test module 136 may link head to windshield (HW) taken from the center point between eyes of the ATD 145 to a vehicle windshield directly in front of the ATD 145. The test module 136 may link nose to rim (NR) taken from a tip of the nose (not shown) of the ATD 145 to a steering wheel of the ATD 145 at a 12 o'clock position. The test module 136 may link steering wheel to chest perpendicular (SCP), steering wheel to chest reference (SCR), and steering wheel to chest horizontal (SCH) that are taken from the chest of the ATD 145 to various planes that intersect the steering wheel. The test module 136 may also set a seat angle (SA) for the virtual vehicle 147. The test module 136 may also link knee to dash left (KDL) taken from a knee pivot to a point on the dash that is directly level to the center of the knee. The test module 136 may also link chest to dash (CD), striker to knee (SK), rib to abdomen (RA), neck angle seated (NAS), and various other standard body parts of the ATD 145 and components of the generic virtual vehicle 147.

A virtual module 150 may be used to generate a virtual vehicle and may include a computer aided design (CAD) system, computer aided manufacturing system (CAM), and/or a computer aided engineering (CAE) system for designing and developing a vehicle package or the like. For example, the CAD system may be a Computer Aided Three dimensional Interactive Application (CATIA) system. CATIA may support multiple stages of product development. The stages range from conceptualization, through design (CAD) and manufacturing (CAM), until analysis (CAE). The virtual vehicle may be a 2-dimensional (2-D) and/or 3-D image of a vehicle or parts of the vehicle.

The virtual module 150 provides digitized data, particularly CAD or vector data (or another data format), which can be visualized. The data can be provided, for example, on a DVD, CD-ROM or in a databank accessible online.

A center of competence (COC) module 200 may be tools used by an engineering group to analyze various angles of the vehicle. The tools may include data and graphical representations of vehicle components and tools for measuring and otherwise evaluating virtual vehicle models and ATDs within the vehicles. For example, the COC module 200 may include information relating to safe and/or standard steering wheel angles. If a virtual vehicle includes a steering wheel angle that differs from the COC steering wheel angles, engineers and/or dedicated software may analyze the differing steering wheel angles to determine if they meet safety standards. If they do, the OPM 100 may arrange the ATD according to those steering angles.

A vehicle testing module 250 may include software that may be used by an engineering group to test and evaluate tests on virtual vehicles and ATDs. The test module 250 may include a simulation module 252 that simulates impact tests. The test module 250 may also include an occupant located module 254 to determine the results of the tests. Further, an occupant measurement module 256 may receive the vehicle and ATD configuration from the OPM 100 for use in the other test modules 252, 254.

A vehicle development module 300 includes tools that may be used by engineers to evaluate occupant positioning in view of further vehicle development. The vehicle development module 300 may include an occupant measurement module 302 that receives OPM 100 signals including the virtual vehicle and ATD configuration. The vehicle development module 300 also includes a test data module 304 that stores data from impact tests. The test data module 304 may also evaluate test data and occupant measurement data to determine whether altering the vehicle would result in acceptable impact test results. The vehicle design module 300 may change vehicle design but changes may be required to be within parameters that are limited by occupant measurements.

An optimization module 310 may include software that may be used to optimize the virtual vehicle design of the virtual module 150 based on OPM configurations.

Figure 5:
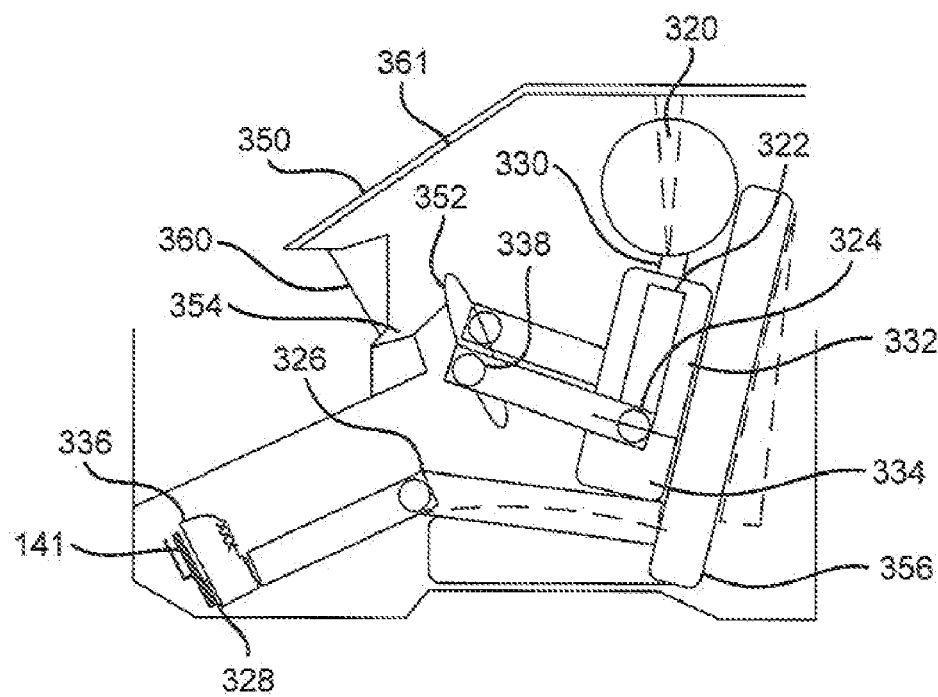
FIG. 5 is a perspective diagram of a virtual dummy in a virtual vehicle according to the present disclosure.

Referring now to FIG. 5, the ATD 320 may include a plurality of moveable elements, such as shoulders 322, elbows 324, knees 326, ankles 328, neck 330, back 332, hip 334, feet 336, hands 338, etc. The moveable elements may also be referred to as rigid body finite elements or body parts. Each moveable element has an initial position that corresponds to, for example, 0,0,0 in an X,Y,Z coordinate system. The initial positions may correspond to a predetermined position of the ATD 320, such as sitting, standing, or driving. The driving position may correspond to a predetermined comfortable position for a driver or passenger. The driver may be positioned left, right, or center relative to the front of the vehicle.

The virtual module 150 may generate a virtual vehicle 350, which is partially illustrated in FIG. 5. The virtual module 150 may parameterize the vehicle 350. For example, the virtual module 150 may define a virtual vehicle having elements, such as: a steering wheel 352, steering column 354, seat 356, pedals 141, dash/control panel 360, windshield 361, etc. Each of the elements may be oriented according to parameters based on their respective sizes and shapes and further according to predetermined design parameters. Design parameters may include, for example, that the steering wheel 352 is on the left side of the vehicle and the gas and brake pedals 141 are positioned relative to the steering wheel 352.

The positioning control module 110 may receive the ATD and virtual vehicle parameters and may position and/or generate a positioning set-up for the ATD 320 within the virtual vehicle 350. The positioning set-up may correspond to instructions (e.g. the links discussed previously) or other computer readable information that relates an ATD to a generic virtual vehicle from the test module 136. The positioning control module 110 may generate multiple different positions for the ATD 320 relative to the virtual vehicle 350. For example, different types of vehicle impact tests may require an ATD 320 to be in different positions, such as restrained in a seat-belt, unrestrained, hands-off the steering wheel, slumped over the steering wheel, etc. Therefore, the positioning control module 110 may generate positioning instructions based on the FMVSS for one or more positions of the ATD 320. The different groups of the vehicle manufacturer may use the different positions to test and otherwise analyze the vehicle.

The positioning control module 110 may automatically locate a portion of the virtual vehicle 350 that interacts with or otherwise is supposed to contact the ATD 320. The positioning control module 110 may then lock the portion of the vehicle 350 to the respective portion of the ATD 320. For example, the left hand of the ATD 320 may be required to be placed at a first position on the steering wheel 352, and the head of the ATD 320 may be required to be a certain distance from the steering wheel 352 based on the set of parameters adapted from the FMVSS. The positioning control module 110 locks the left hand 338 and head to the steering wheel 352 so that whenever the FMVSS based parameters are used by groups, the hand 338 and steering wheel 352 are locked together. The left hand 338 may therefore be at an initialized positioned (0,0,0) and may be moved to a position that may differ from the initial position that corresponds to a linked location relative to the steering wheel 352.

Those skilled in the art can now appreciate from the foregoing description that the broad teachings of the disclosure can be implemented in a variety of forms. Therefore, while this disclosure includes particular examples, the true scope of the disclosure should not be so limited since other modifications will become apparent to the skilled practitioner upon a study of the drawings, the specification, and the following claims.

What is claimed is:

1. A vehicle test system comprising:
an occupant positioning module including:
    a virtual vehicle module that receives a virtual vehicle having a plurality of different components;
    a virtual ATD module that receives a virtual dummy having a plurality of different body parts;
    a regulation conversion module that receives a first adapted vehicle standard and generates a set of parameters defining relationships between the virtual dummy and a generic virtual vehicle having a plurality of generic components based on the first adapted vehicle standard, the relationships including a set of fixed points on one or more of the plurality of generic components that are linked to one or more of the plurality of different body parts; and
    a positioning control module that determines a set of points in the virtual vehicle that correspond to the set of fixed points on the generic virtual vehicle and generates a position configuration for the virtual dummy in the virtual vehicle by linking the one or more of the plurality of different body parts to the set of points in the virtual vehicle based on the set of parameters generated by the regulation conversion module; and
    N groups that receive the set of parameters from the occupant position module, wherein N is an integer greater than 1, wherein when one of the N groups changes a design of the virtual vehicle, the virtual dummy is automatically positioned in the virtual vehicle using the set of parameters, thereby adhering to the first adapted vehicle standard.

2. A method for testing a vehicle, comprising:
receiving, at one or more processors, a virtual vehicle having a plurality of different components;
generating, at the one or more processors, a first set of parameters that correspond to points on one or more of the plurality of different components of the virtual vehicle;
receiving, at the one or more processors, a virtual dummy having a plurality of different body parts;
generating, at the one or more processors, a second set of parameters that correspond to portions of the virtual dummy;
receiving, at the one or more processors, a first adapted vehicle standard;
generating, at the one or more processors, a set of link parameters defining relationships between the virtual dummy and a generic virtual vehicle having a plurality of generic components based on the first adapted vehicle standard, the relationships including a set of fixed points on one or more of the plurality of generic components that are linked to one or more of the plurality of different body parts in accordance with the first adapted vehicle standard;
determining, at the one or more processors, a set of points in the virtual vehicle that correspond to the set of fixed points on the generic virtual vehicle;
generating, at the one or more processors, a position configuration for the virtual dummy in the virtual vehicle by linking the one or more of the plurality of different body parts to the set of points in the virtual vehicle based on the set of link parameters; and
sending, at the one or more processors, the set of link parameters to a plurality of groups that analyze the virtual vehicle based on the set of link parameters, wherein when one of the plurality of groups changes a design of the virtual vehicle, the virtual dummy is automatically repositioned in the virtual vehicle using the set of link parameters, thereby adhering to the first adapted vehicle standard.

3. An occupant positioning system comprising:
a virtual vehicle module that receives a virtual vehicle having a plurality of different components;
a virtual ATD module that receives a virtual dummy having a plurality of different body parts;
a regulation conversion module that receives a first adapted vehicle standard and generates a set of parameters defining relationships between the virtual dummy and a generic virtual vehicle having a plurality of generic components based on the first adapted vehicle standard, the relationships including a set of fixed points on one or more of the plurality of different generic components that are linked to one or more of the plurality of different body parts; and
a positioning control module that determines a set of points in the virtual vehicle that correspond to the set of fixed points on the generic virtual vehicle and generates a position configuration for the virtual dummy in the virtual vehicle by linking the one or more of the plurality of different body parts to the set of points in the virtual vehicle based on the set of parameters generated by the regulation conversion module;
wherein when a design of the virtual vehicle is changed, the positioning control module automatically repositions the virtual dummy in the virtual vehicle using the set of parameters, thereby adhering to the first adapted vehicle standard.

4. The vehicle test system of claim 1 further comprising a computer aided design (CAD) module that generates said virtual vehicle.

5. The vehicle test system of claim 1 further comprising a test module that generates said first adapted vehicle standard based on a first vehicle standard, wherein said first adapted vehicle standard includes associations between components of said virtual vehicle, which has at least similar components as said generic virtual vehicle and portions of said virtual dummy.

6. The vehicle test system of claim 5 wherein said occupant positioning module generates said set of parameters by applying said associations to said components of said generic virtual vehicle.

7. The vehicle test system of claim 1 further comprising a positioning code module that converts said set of parameters into a code, wherein said N groups receive said set of parameters via said code.

8. The vehicle test system of claim 7 wherein said code comprises Extensible Markup Language (XML).

9. The vehicle test system of claim 1 wherein said generic virtual vehicle include a first set of points in an X,Y,Z coordinate system that correspond to components and said virtual dummy includes a second set of points in said X,Y,Z coordinate system that correspond to body parts.

10. The vehicle test system of claim 9 wherein said occupant positioning module generates said set of parameters by linking at least a number of said first set of points with at least a number of said second set of points, wherein said linked first and second sets of points remain at least one of predetermined distances apart and at predetermined angles relative to one another.

11. The vehicle test system of claim 10 wherein said predetermined distances and said predetermined angles are based on said first adapted vehicle standard.

12. The vehicle test system of claim 1 wherein said first adapted vehicle standard corresponds to at least one of Federal Motor Vehicle Safety Standards (FMVSS), New Car Assessment Program (NCAP) standards, Insurance Institute for Highway Safety (IIHS) standards, Economic Commission for Europe (ECE) standards, European New Car Assessment Program (EuroNCAP) standards, and Side Impact New Car Assessment Program (SINCAP) standards.

13. The vehicle test system of claim 1 wherein a first of said N groups comprises a group that performs impact tests, and wherein a second one of said N groups designs and develops vehicles.

14. The vehicle test system of claim 13 wherein said first one of said N groups receives said set of parameters and relates said virtual vehicle and said dummy according to said set of parameters.

15. The method of claim 2 further comprising receiving, at the one or more processors, said virtual dummy from a virtual dummy database that includes at least one of virtual $95^{th}$ percentile, $50^{th}$ percentile, $5^{th}$ percentile, and child dummies.

16. The method of claim 2 further comprising generating, at the one or more processors, said adapted vehicle standard based on associations between the generic virtual vehicle and said portions of said virtual dummy, wherein said associations are based on a first vehicle standard.

17. The method of claim 2 further comprising converting, at the one or more processors, said set of parameters into a code, wherein said plurality of groups receive said set of parameters via said code.

18. The method of claim 2 wherein said first set of parameters include a first set of points in an X,Y,Z coordinate system that are associated with said virtual vehicle and said second set of parameters include a second set of points in said X,Y,Z coordinate system.

19. The method of claim 18 further comprising generating, at the one or more processors, said set of parameters by linking at least a number of said first set of points with at least a number of said second set of points, wherein said linked first and second sets of points remain at least one of predetermined distances apart and at predetermined angles relative to one another, wherein said predetermined distances and said predetermined angles are based on said first vehicle standard.

20. The vehicle test system of claim 1 further comprising a test data module that determines whether changes in the design result in acceptable impact test results.

* * * * *